United States Patent
Brown et al.

(10) Patent No.: US 6,436,785 B2
(45) Date of Patent: Aug. 20, 2002

(54) METHOD OF MANUFACTURING SEMICONDUCTOR DEVICE WITH A TUNNEL DIODE

(75) Inventors: Adam R. Brown; Godefridus A. M. Hurkx; Wiebe B. De Boer; Jan W. Slotboom, all of Eindhoven (NL)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/832,724

(22) Filed: Apr. 11, 2001

Related U.S. Application Data

(62) Division of application No. 09/078,231, filed on May 13, 1998, now Pat. No. 6,242,762.

(30) Foreign Application Priority Data

May 16, 1997 (EP) .......................................... 97201478

(51) Int. Cl.[7] .............................................. H01L 21/20
(52) U.S. Cl. ....................... 438/380; 438/237; 438/979; 257/199
(58) Field of Search ................................. 438/380, 237, 438/979, 936, 815, FOR 288, FOR 286, FOR 415, FOR 476; 257/199; 148/DIG. 72

(56) References Cited

U.S. PATENT DOCUMENTS

| | | | |
|---|---|---|---|
| 5,148,267 A | * | 9/1992 | Ty Tan et al. |
| 5,684,737 A | * | 11/1997 | Wang et al. |
| 6,188,083 B1 | * | 2/2001 | Kano |

FOREIGN PATENT DOCUMENTS

| | | | |
|---|---|---|---|
| JP | 403270072 A | * | 12/1991 |

* cited by examiner

Primary Examiner—George Fourson
Assistant Examiner—Thanh V Pham
(74) Attorney, Agent, or Firm—Steven R. Biren

(57) ABSTRACT

A semiconductor device with a tunnel diode comprises two mutually adjoining semiconductor regions (2, 3) of opposed conductivity types having high enough doping concentrations to provide a tunneling junction. Portions (2A, 3A) of the semiconductor regions adjoining the junction comprise a mixed crystal of silicon and germanium. The doping concentration of both phosphorus and boron are substantially increased, given the same amount of dopants being offered as during the formation of the remainder of the regions. The tunneling efficiency is substantially improved, and also because of the reduced bandgap of said portions (2A, 3A). A much steeper current-voltage characteristic both in the forward and in the reverse direction is achieved. Thus, the tunneling pn junction can be used as a transition between two conventional diodes which are stacked one on the other and formed in a single epitaxial growing process. The doping concentration may be $6 \times 10^{19}$ or even more than $10^{20}$ at/cm$^3$. A simple method of manufacturing such a device is preferably done at a temperature between 550° C. and 800° C.

17 Claims, 2 Drawing Sheets

METHOD OF MANUFACTURING SEMICONDUCTOR DEVICE WITH A TUNNEL DIODE

CROSS REFERENCE TO RELATED APPLICATIONS

This is a divisional of application Ser. No. 09/078,231 filed May 13, 1998 now U.S. Pat. No. 6,242,762.

BACKGROUND OF THE INVENTION

This invention relates to a semiconductor device with a semiconductor diode comprising a silicon semiconductor body with a semiconductor substrate and a first semiconductor region of a first conductivity type which is provided with a first connection conductor and which adjoins a second semiconductor region of a second conductivity type opposed to the first and provided with a second connection conductor, the doping concentrations of both the first and the second semiconductor region being so high that the pn junction between the first and the second semiconductor region forms a tunnelling junction. The invention also relates to a method of manufacturing such a device.

Such a device is known from Physics of Semiconductor Devices, by S. M. Sze, John Wiley & Sons, 1969, pp. 150–151. Such devices are attractive on account of their steep current-voltage characteristic in both the forward and the reverse direction and are quite useful in applications such as microwave amplification and switching at high speed.

A disadvantage of the known device is that the forward characteristic, but in particular the reverse characteristic is not yet steep enough for some applications. It is accordingly an object of the present invention to provide a device with an improved, i.e. steeper forward characteristic and especially with an improved reverse characteristic. The invention also has for its object to provide a simple and reliable method for the manufacture of such improved devices.

SUMMARY OF THE INVENTION

According to the invention, a device of the kind mentioned in the opening paragraph is for this purpose characterized in that the portions of the first and of the second semiconductor region which adjoin the junction comprise a mixed crystal of silicon and germanium. The invention is based first of all on the recognition that a mixed crystal of silicon and germanium has a smaller bandgap than silicon and that a smaller bandgap increases the tunnelling probability, which renders the current-voltage characteristic steeper. The invention is further based on the surprising recognition that a mixed crystal of silicon and germanium makes possible a higher n-doping level as well as a higher p-doping level than in silicon. This is mostly caused at the n-side of the junction by the fact that more dopant atoms, for example, phosphorus atoms, are incorporated into the lattice, and at the p-side this is mostly caused by the fact that the dopant atoms, for example, boron atoms, have a lower mobility, which creates a steeper doping profile with a higher maximum concentration. As a result, the maximum concentration of charge carriers at both sides of the tunnelling junction is greater than in the case of a tunnelling junction in pure silicon. The tunnelling efficiency also increases as a result of this. A device according to the invention is found to have a very steep forward and reverse characteristic, the latter being steeper than the former. This opens perspectives for an attractive application of the device according to the invention in which the tunnelling pn junction is used as a junction between two normal diodes, for example, pn or pin diodes, which are used stacked on one another. Such a stacking may then be manufactured in a single epitaxial growing process instead of through the stacking of discrete, individual diodes provided with contact metallizations. A further important advantage of said steeper current-voltage characteristic is that the dissipation decreases, so that a device according to the invention will have a longer life than the conventional device.

In a preferred embodiment of a device according to the invention, the portions of the first and the second semiconductor region which adjoin the tunnelling junction have a thickness which lies between 5 and 30 nm and a germanium content which lies between 10 and 50 at %. Excellent results were obtained thereby. Thus a device was realized in which said portions are 27 nm thick and comprise 25 weight % germanium, in which case the current density through the tunnelling pn junction is 1 A/cm$^2$ for 0.3 V and 30 A/cm$^2$ for 1 V in the forward direction. In the reverse direction, the same measurements even yielded 10 A/cm$^2$ and 80 A/cm$^2$, respectively. The required majority charge carrier concentration is at least approximately $5 \times 10^{19}$. Preferably, the thickness and the germanium content of said portions are so chosen that the mechanical stress built up as a result of the difference in lattice constant between germanium and silicon does not lead to the creation of fatal dislocations. This means that the product of the total thickness of said portions and the relative difference in lattice constant must be chosen to be smaller than or equal to approx. 30 nm.

A very attractive embodiment of a semiconductor device according to the invention is characterized in that further semiconductor regions are present between the first semiconductor region and the first connection conductor or between the second semiconductor region and the second connection conductor, forming one or several further pn junctions which are forward biased when the tunnelling pn junction is reverse biased and which are separated from one another by two further semiconductor regions having the same properties as the first and the second semiconductor region and forming a further tunnelling pn junction. Such a stacking of diodes is particularly suitable for use as a high-voltage switching diode, where it is determined from the desired total breakdown voltage and the breakdown voltage of each individual diode how great the number of further pn junctions should be. This may be any integer number, for example a number between 1 and 10. Thanks to the tunnelling pn junction present between each pair of further pn junctions, such a stacking of diodes has an excellent current-voltage characteristic. It is very important that the invention renders it acceptable to provide all diodes (including the tunnelling diodes) one after the other in a single epitaxial deposition step. This simplifies the manufacture.

The lowermost and the uppermost semiconductor region of such a stacking then act as the contact regions and have a high doping concentration suitable for this purpose. The breakdown voltage of each individual pn junction may be freely chosen. If a comparatively high breakdown voltage is desired, a further pn junction may comprise an i-region.

Preferably the p-type conductivity type is chosen for the conductivity type of the first semiconductor region. This results in the most abrupt junction, which is very desirable. This phenomenon is due to the tendency of n-type dopants, e.g. P or As, to segregate on the surface.

A method of manufacturing a semiconductor device with a semiconductor diode, whereby a first semiconductor region of a first conductivity type is formed in a silicon semiconductor body having a semiconductor substrate and is provided with a first connection conductor, and a second semiconductor region of a second conductivity type opposed to the first is formed so as to adjoin the first semiconductor region and is provided with a second connection conductor, the doping concentrations of both the first and the second semiconductor region being chosen to be so high that the pn junction between the first and the second semiconductor region forms a tunnelling junction, according to the invention, is characterized in that the portions of the first and of the second semiconductor region which adjoin the junction are formed by a mixed crystal of silicon and germanium. Devices according to the invention are obtained in a simple manner by such a method.

Preferably, further semiconductor regions are formed between the first semiconductor region and the first connection conductor or between the second semiconductor region and the second connection conductor, forming one or several pn junctions which are forward biased when the tunnelling pn junction is reverse biased and which are separated from one another by further semiconductor regions having the same properties as the first and the second semiconductor region and forming a further tunnelling pn junction. The device mentioned above comprising a stack of diodes is obtained thereby, preferably in an epitaxial CVD (=Chemical Vapor Deposition) process. The semiconductor regions are preferably provided at comparatively low temperatures, for example at 550–800° C., because it is desirable for the doping profiles not only to be, but also to remain very steep, and because the desired thickness of the profiles is very small. Such a low growing temperature also contributes to the invention because appreciably more doping elements are incorporated into the lattice at low temperatures than at the more usual, higher growing temperatures.

BRIEF DESCRIPTION OF THE DRAWING

The invention will now be explained in more detail with reference to two embodiments and the accompanying drawing, in which.

The Figures are diagrammatic and not drawn true to scale, the dimensions in the thickness direction being particularly exaggerated for greater clarity. Semiconductor regions of the same conductivity type have been hatched in the same direction as a rule.

DESCRIPTION OF THE PREFERRED EMBODIMENTS

Figure 1:
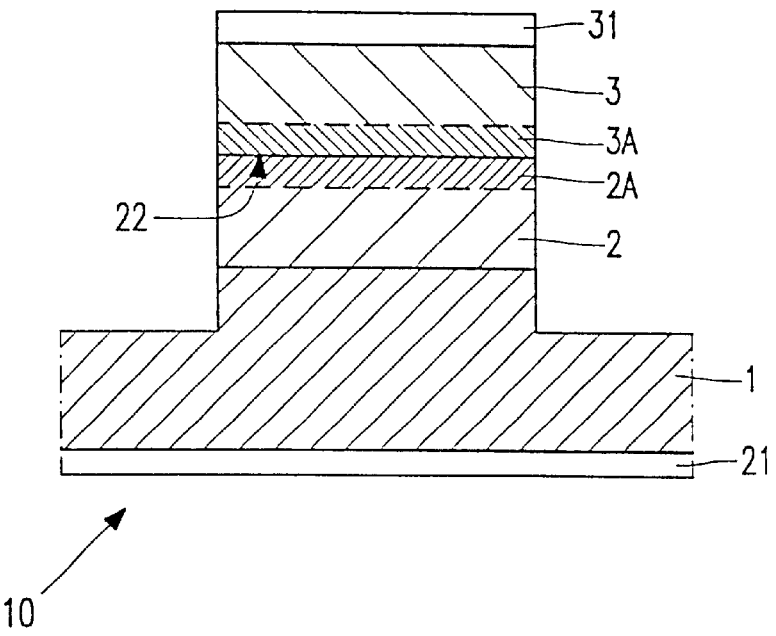
FIG. 1 diagrammatically shows a first embodiment of a device according to the invention in a cross-section perpendicular to the thickness direction.

FIG. 1 is a diagrammatic cross-sectional view perpendicular to the thickness direction of a first embodiment of a device with a tunnel diode according to the invention. The device comprises a semiconductor body 10 made of silicon, with a substrate 1 which is n++ doped with antimony here and whose resistivity is 6–20 mΩcm. The semiconductor body 10 comprises a first semiconductor region 2 of a first conductivity type, here the n-type, which is provided with a first connection conductor 21, via the substrate 1 in this case. A second semiconductor region 3 of a second conductivity type opposed to the first, so the p-type, adjoins the former and is provided with a second connection conductor 31. The doping concentrations of both the first and the second semiconductor region 2, 3 are so high, $1.2 \times 10^{19}$ at/cm$^3$ in this case, of phosphorus and boron, respectively, that the pn junction 22 between them is a tunnelling junction.

According to the invention, the portions 2A, 3A of the first and the second semiconductor region 2, 3 which adjoin the junction 22 comprise a mixed crystal of silicon and germanium. The invention is based first of all on the recognition that a mixed crystal of silicon and germanium has a smaller bandgap than silicon, and that a smaller bandgap increases the tunnelling probability, so that the current-voltage characteristic becomes steeper, which is desirable for many applications of a tunnel diode. The invention is further based on the surprising recognition that a mixed crystal of silicon and germanium renders possible both a higher n-type doping and a higher p-type doping than silicon, especially for the impurities phosphorus and boron mentioned above. This is mainly caused in the case of phosphorus by an enhanced incorporation of dopant atoms into the lattice and, in the case of boron, mainly by a reduced mobility of the dopant atoms, which results in a steep doping profile with a high maximum concentration. As a result, the maximum concentration of charge carriers is greater on both sides of the tunnelling junction 22 than in the case of a tunnel diode in pure silicon. The tunnelling efficiency is also increased by this.

Figure 2:
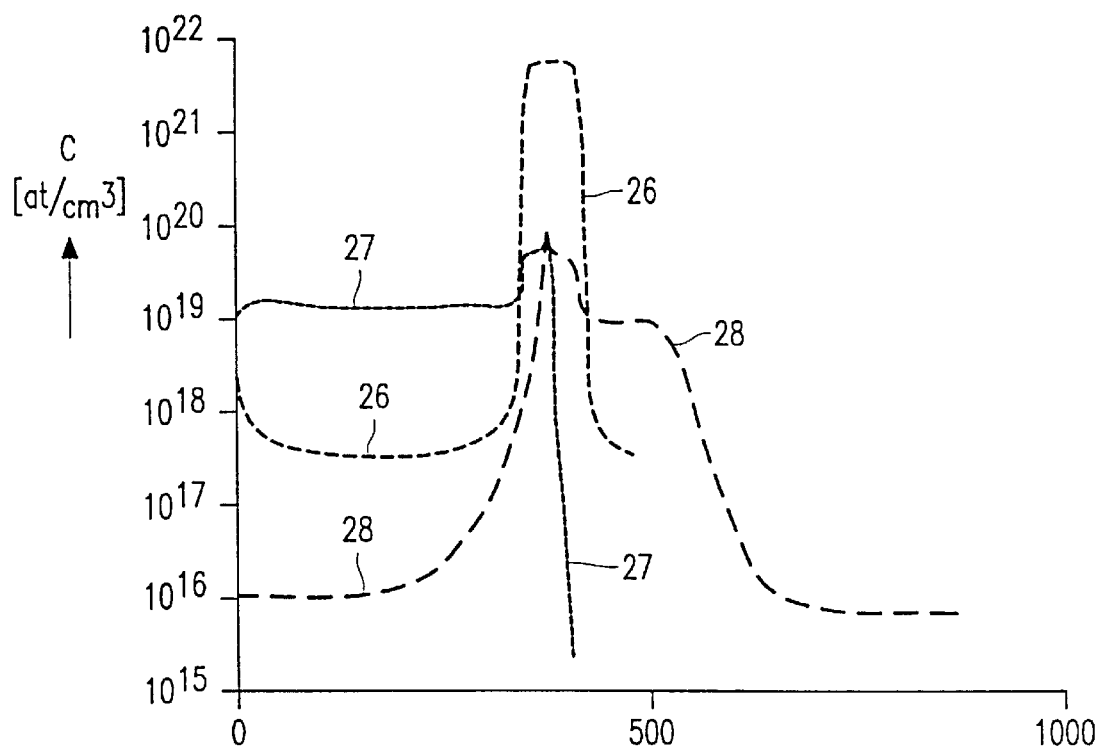
FIG. 2 diagrammatically shows the composition as a function of the thickness in the device of FIG. 1.

FIG. 2, in which the composition (C) is diagrammatically shown as a function of the thickness (d) of the device of FIG. 1, illustrates the increased doping concentration of the portions 2A, 3A of the first and the second semiconductor region 2, 3 lying adjacent the junction 22. Curve 26 shows the concentration gradient of germanium. The tunnelling junction 22 is at the centre of this profile 26, at a thickness of approximately 380 nm measured from the upper surface of the device of FIG. 1. Curves 27 and 28 correspond to the boron and the phosphorus profile, respectively. The increase in the two concentrations to approximately $7 \times 10^{19}$ at/cm$^3$ adjacent the tunnelling junction 22 is clearly visible. SIMS (=Secondary Ion Mask Spectrometry) was used as the measuring technique for FIG. 2. It is noted that also the phosphorus atoms present at the other side of the tunnelling junction 22 appear to play a part in the increase in the boron concentration.

A device according to the invention is found to have a very steep forward characteristic and an even steeper reverse characteristic. This opens the perspective for inter alia an attractive application where the tunnelling pn junction 22 is used as a transition between two switching diodes, for example pn or pin diodes, which are used one stacked on the other. Such a stacking may then be manufactured in a single epitaxial growing process instead of the stacking together of discrete, individual diodes each provided with a contact metallization.

Figure 3:
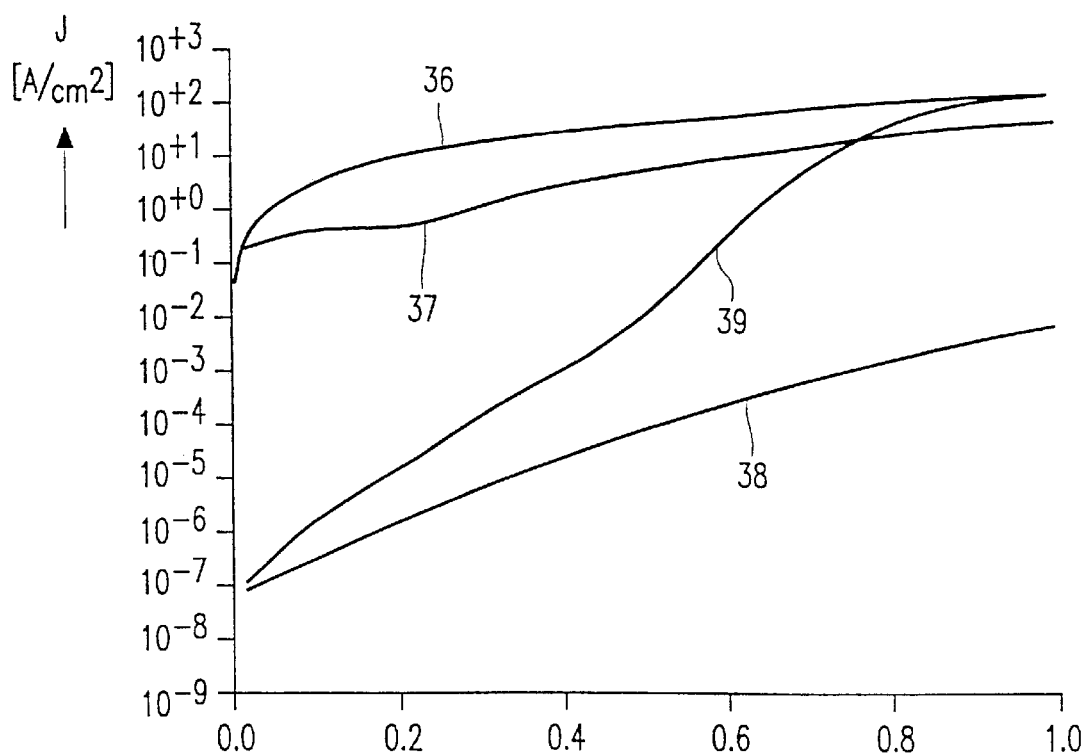
FIG. 3 diagrammatically shows the current density (j) as a function of the voltage (V) across the tunnelling pn junction of the device of FIG. 1 and of a conventional device.

FIG. 3, in which the current density (j) is diagrammatically shown as a function of the voltage (V) across the tunnelling pn junction 22 of the device of FIG. 1 and of a known device, illustrates this aspect of the invention. Curves 36, 37 represent the reverse and the forward characteristic of the device of FIG. 1, respectively. Curves 38, 39 show these characteristics for a device comparable to the device of FIG.

1, having the same construction and dimensions, but not comprising germanium. FIG. 3 shows that a device according to the invention has a much better reverse and forward characteristic than the known device, especially at a low voltage, for example 0.3 V. The current density which can be achieved in a device according to the invention approaches the value of 100 A/cm$^2$ both in the reverse and in the forward direction.

The portions 2A, 3A of the first and second semiconductor regions 2, 3 adjoining the tunnelling junction 22 preferably have a thickness which lies between 5 and 30 nm and a germanium content which lies between 10 and 50 weight %. In this example, said thickness is approximately 27 nm while the germanium content is approximately 25 weight %. The measured capacitance of the tunnelling junction 22 was approximately $5.2 \times 10^5$ pF/cm$^2$, which suggests a depletion thickness of 20 nm. This corresponds fairly well to an expected depletion thickness of approximately 15 nm in the case of a perfectly abrupt transition to the doping concentration(s) mentioned above of approximately $6 \times 10^{19}$ at/cm$^3$ and $10^{19}$ at/cm$^3$ in the germanium-containing portions 2A, 3A and the remainder of the semiconductor regions 2, 3, respectively. A depletion thickness of approximately 10 nm or less is necessary for realizing tunnelling currents greater than 100 A/cm$^2$ and is believed to be achievable with a device according to the invention.

The device of FIG. 1 is manufactured as follows: the manufacture starts with a 675 $\mu$m thick substrate with a diameter of 6 inches and made of (100) silicon on which a number of semiconductor layers are provided in succession in an atmospheric CVD process at a temperature of 700° C. The growing rate at this temperature is approximately 1–20 nm/min. First a 100 nm thick, phosphorus-doped n-type monocrystalline epitaxial layer 2 of silicon is provided. A 27 nm thick layer 2A of silicon to which 25% germanium was added is provided thereon, the phosphine concentration in the gas phase being the same here as during the provision of the silicon layer 2, i.e. approximately 2 ppm. Then a 27 nm thick layer 3A of silicon comprising 25% germanium is provided and is p-type doped with boron, during which the gas phase in addition comprises approximately 2 ppm diborane. The final epitaxial layer which is now deposited is a 200 nm thick layer 3 of silicon, the boron content in the gas phase being the same. The lower side of the substrate 1 is metallized with aluminum, and the upper side of the semiconductor body 10 is provided with a metallization comprising 75 nm titanium, a thin layer of titanium nitride, and a layer of aluminum, which metallization is patterned by means of photolithography. Round mesas are now etched by means of an etchant usual for etching silicon, comprising the above layers 2, 2A, 3A, 3 and a small portion of the substrate 1, each mesa having a surface area of $10^4$ $\mu$m$^2$. The lateral sides of the mesas are passivated by means of a glass, for example TEOS (=Tetra Ethyl OrthoSilicate). Individual devices according to the invention are obtained in that the substrate 1 is sawn between adjoining mesas and in two mutually perpendicular directions.

Figure 4:
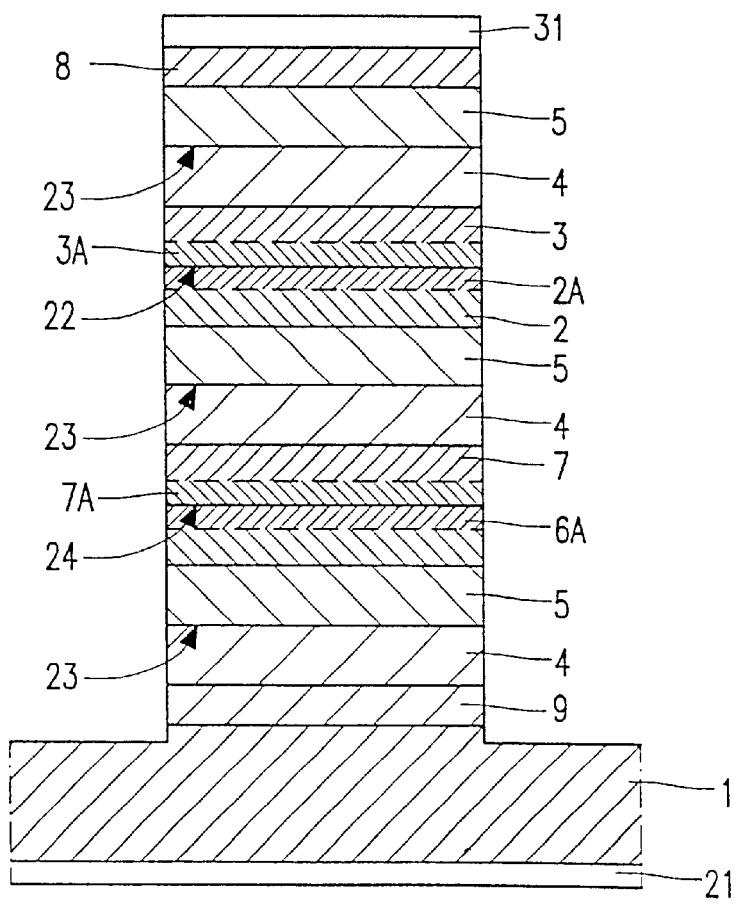
FIG. 4 is a diagrammatic cross-section perpendicular to the thickness direction of a second embodiment of a device according to the invention.

FIG. 4 finally diagrammatically shows a cross-section perpendicular to the thickness direction of a second embodiment of a device according to the invention. The semiconductor body 10 here comprises not only the semiconductor regions 2, 2A, 3A, 3 between the first semiconductor region 2 and the first connection conductor 21 or, in the present example and, between the second semiconductor region 3 and the second connection conductor 31, but also further semiconductor regions 4, 5 which form one or several, in this case three further pn junctions 23 which are forward biased when the tunnelling pn junction 22 is reverse biased, and which are mutually separated by two other further semiconductor regions 6, 7 having the same properties as the first and the second semiconductor region 2, 3 and forming a further tunnelling pn junction 24. The substrate 1 is again of the n conductivity type in this example. The regions 2, 5, 6 have the p conductivity type here, and the regions 3, 4, 7 the n conductivity type, the doping concentrations of the regions 4, 5 being lower than those of the regions 2, 3, 6, 7. The stacking is bounded by regions 8, 9 of the p and the n conductivity type, respectively, both having a high doping concentration of approximately $10^{19}$ at/cm$^3$, and acting as contact regions. The regions 4, 5 have a comparatively low doping concentration of $10^{15}$ to $10^{19}$ at/cm$^3$. Such a stack of diodes 23 is particularly suitable for use as a high-voltage switching diode, where it is determined by the desired total breakdown voltage and the breakdown voltage of each individual diode how great the number of further pn junctions should be. This may be any integer number, for example a number between 1 and 10, in the present example 3.

Such a stack of diodes 23 has an excellent current-voltage characteristic thanks to the tunnelling pn junction 22, 24 which is present between each pair of further pn junctions 23. It is very important that the improved current-voltage characteristic renders it possible to form all diodes 23 (including the tunnelling diodes 22, 24) in a single growing process, i.e. in that all (further) semiconductor regions 2, 3, 4, 5, 6, 7, 8, 9 are formed as epitaxial monocrystalline semiconductor regions 2, 3, 4, 5, 6, 7, 8, 9. This simplifies the manufacture, which in other respects takes place in a manner similar to that indicated above for the first embodiment. The properties of the layers 2, 2A, 3A, 3, 6, 6A, 7A, 7 are chosen as in the first example. The layers 4, 5, 8, 9 are given thicknesses, for example, which lie in the range from 1 to 5 $\mu$m. The metal layers 21, 31 and the dimensions of the mesas are also the same as in the first example. The breakdown voltage of the diodes 23 lies in the range from 10 to 100 V.

The invention is not limited to the embodiments given above, since many modifications and variations are possible to those skilled in the art within the scope of the invention. Thus compositions and thicknesses may be chosen for the various (semiconductor) regions or layers other than those mentioned in the examples. It is also possible to use alternative deposition techniques instead of those mentioned, such as MBE (=Molecular Beam Epitaxy).

A device according to the invention may also be a more complicated device than a single diode or stack of diodes. Such more complicated devices, such as ICs (=Integrated Circuits) comprising inter alia transistors, may also advantageously comprise one or several tunnelling pn junctions according to the invention.

What is claimed is:

1. A method of manufacturing a semiconductor device with a semiconductor diode, which comprises: forming a first semiconductor region of a first conductivity type in a silicon semiconductor body having a semiconductor substrate, providing a first connection conductor for the first semiconductor region, forming a second semiconductor region of a second conductivity type opposed to the first so as to adjoin the first semiconductor region, providing a second connection conductor for the second semiconductor region, wherein, the doping concentrations of both the first semiconductor region and the second semiconductor region are so high that the pn junction between the first semiconductor region and the second semiconductor region forms a tunnelling junction, and wherein portions of the first semiconductor region and of the second semiconductor region which adjoin the pn tunneling junction are formed by a mixed crystal of silicon and germanium.

2. A method as claimed in claim 1, further comprising:
forming further semiconductor regions between the first semiconductor region and the first connection conductor or between the second semiconductor region and the second connection conductor, forming one or several further pn junctions which are forward biased when the tunnelling pn junction is reverse biased and which are separated from one another by other further semiconductor regions having the same properties as the first semiconductor region and the second semiconductor region and which together form a further tunnelling pn junction.

3. A method as claimed in claim 2, which further comprises: forming by epitaxy monocrystalline semiconductor layer regions stacked on top of one another and at a temperature of between 550° C. and 800° C.

4. A method as claimed in claim 1, which further comprises:
forming by epitaxy monocrystalline semiconductor layer regions stacked on top of one another and at a temperature of between 550° C. and 800° C.

5. The method as claimed in claim 1 wherein the adjoining portions of the first and second semiconductor regions have a doping concentration of at least $5 \times 10^{19}$ at/cm$^3$.

6. The method as claimed in 1 wherein the steps of forming the first and second semiconductor regions form said adjoining portions with a thickness between 5 and 30 nm and a germanium content between 10 and 50 weight %.

7. The method as claimed in claim 2 wherein one of the further semiconductor regions is not doped.

8. The method as claimed in claim 4 wherein the semiconductor layer regions comprise a monocrystalline epitaxial semiconductor material.

9. A method of making a semiconductor diode device, which comprises:
forming a phosphorous-doped n-type monocrystalline epitaxial layer of silicon on a silicon substrate,
forming a first layer of a mixed crystal of silicon and germanium over the epitaxial silicon layer,
forming a second layer of a mixed crystal of silicon and germanium directly on the first silicon-germanium layer,
depositing on the second silicon-germanium layer a monocrystalline epitaxial layer of boron doped p-type silicon, and
applying first and second metalization layers to the bottom and top sides of the layered semiconductor diode, wherein
the first and second silicon-germanium layers have doping concentrations of phosphorous and boron, respectively, so high as to form a tunneling junction between the first and second silicon-germanium layers.

10. The method of making a semiconductor diode device as claimed in claim 9 wherein the first and second silicon-germanium layers are thinner than the n-type monocrystalline silicon layer and the p-type monocrystalline silicon layer, respectively.

11. The method of making a semiconductor diode device as claimed in claim 9 wherein the first and second silicon-germanium layers each have a doping concentration of at least $5 \times 10^{19}$ at/cm$^3$.

12. The method of making a semiconductor diode device as claimed in claim 9 wherein the first and second silicon-germanium layers each have a thickness between 5 and 30 nm and a germanium content between 10 and 50 weight %.

13. The method of making a semiconductor diode device as claimed in claim 9 wherein the first and second layers of silicon-germanium each contain 25% germanium and have a thickness of 27 nm.

14. A method of making a high voltage semiconductor diode device of the type as claimed in claim 9 which further comprises;
forming first and second further phosphorous doped n-type and boron doped p-type monocrystalline silicon layers, respectively, with adjoining further first and second mixed crystal layers of silicon and germanium so as to form a second tunneling junction,
forming a p-n silicon junction between the first and second tunneling junctions, and
forming at least one further p-n silicon junction between one of the tunneling junctions and one of the first and second metallization layers, wherein
at least one of the p-n silicon junctions is formed so that it is forward biased when the first tunneling junction is reverse biased.

15. A method of making a high voltage semiconductor diode device of the type as claimed in claim 14 which comprises;
forming first, second and third silicon p-n junctions with the first tunneling junction sandwiched between the first and second silicon p-n junctions and the second tunneling junction sandwiched between the second and third silicon p-n junctions to form a stacked high voltage semiconductor diode device with said first, second and third silicon p-n junctions oppositely polarized with respect to the first and second tunneling junctions.

16. A method of making a high voltage semiconductor diode device of the type as claimed in claim 14 wherein the p-n silicon junctions are formed with doping concentrations lower than the doping concentrations of the first and second silicon-germanium layers.

17. A method of making a high voltage semiconductor diode device of the type as claimed in claim 14 wherein the high voltage semiconductor diode device is formed in a single epitaxial growing process.

* * * * *